United States Patent [19]

Ito et al.

[11] 4,417,158
[45] Nov. 22, 1983

[54] CLOCK GENERATOR CIRCUIT

[75] Inventors: Akihiko Ito, Kawasaki; Hisami Tanaka, Yokohama; Yoshihisa Takayama, Kawasaki; Seiji Kato, Yamato, all of Japan

[73] Assignee: Fujitsu Limited, Kawasaki, Japan

[21] Appl. No.: 322,720

[22] Filed: Nov. 18, 1981

[30] Foreign Application Priority Data

Nov. 20, 1980 [JP] Japan .................... 55-163607

[51] Int. Cl.³ .............................................. H03K 3/037
[52] U.S. Cl. ..................................... 307/269; 307/262; 328/62
[58] Field of Search ............... 307/262, 269, 289, 291, 307/261, 268, 260, 296 A; 328/62, 63, 74

[56] References Cited

U.S. PATENT DOCUMENTS 3,311,754  3/1967  Linder et al. .................. 307/262
3,448,295  6/1969  Wanlass ......................... 307/269

Primary Examiner—John Zazworsky
Attorney, Agent, or Firm—Staas & Halsey

[57] ABSTRACT

A clock generator circuit for generating two pairs of clock signals comprises a NAND circuit and a NOR circuit cross-coupled to each other and each having an input for receiving a reference clock signal ($\phi_0$). A first inverter is provided between the output of the NAND circuit and the other input of the NOR circuit, and a second inverter is provided between the output of the NOR circuit and the other input of the NAND circuit. A pair of clock signals ($\bar{\phi}_2$, $\phi_2$) are generated from the NAND circuit and the first inverter, while another pair of clock signals ($\phi_1$, $\bar{\phi}_1$) are generated from the NOR circuit and the second inverter.

3 Claims, 26 Drawing Figures

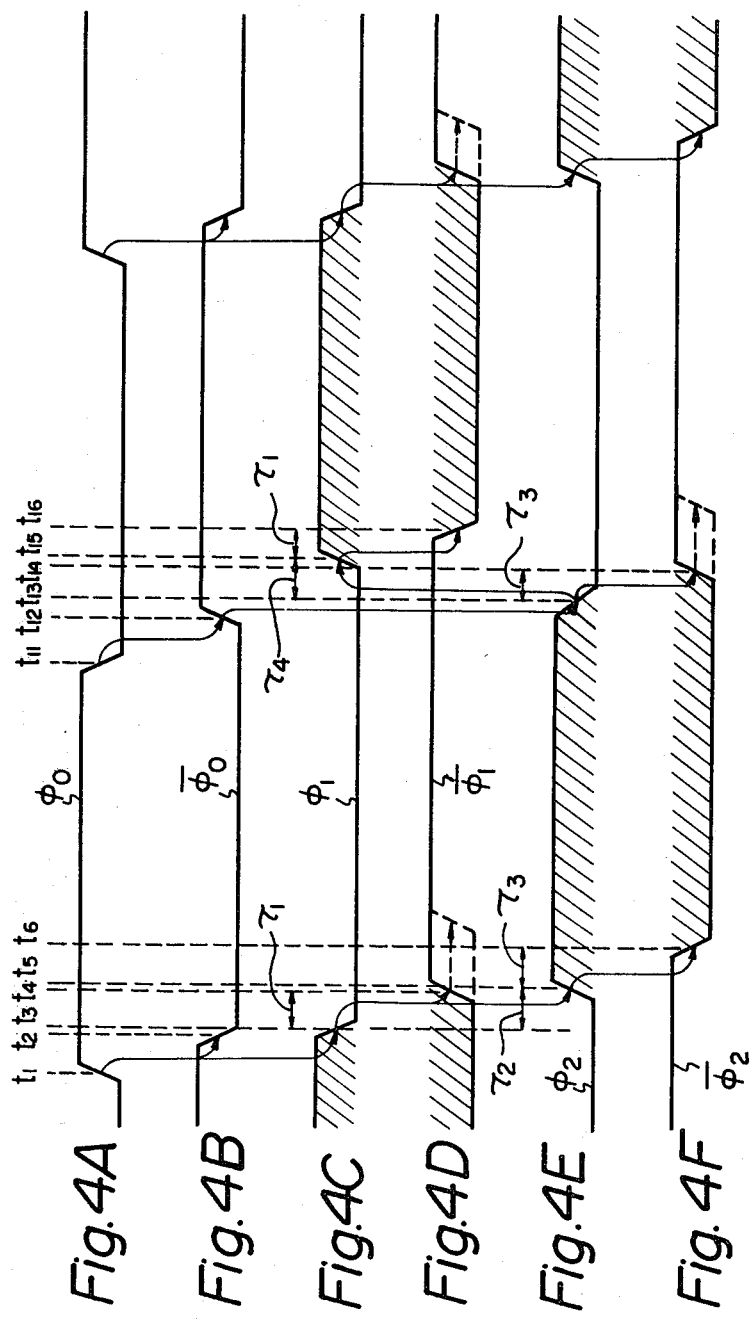

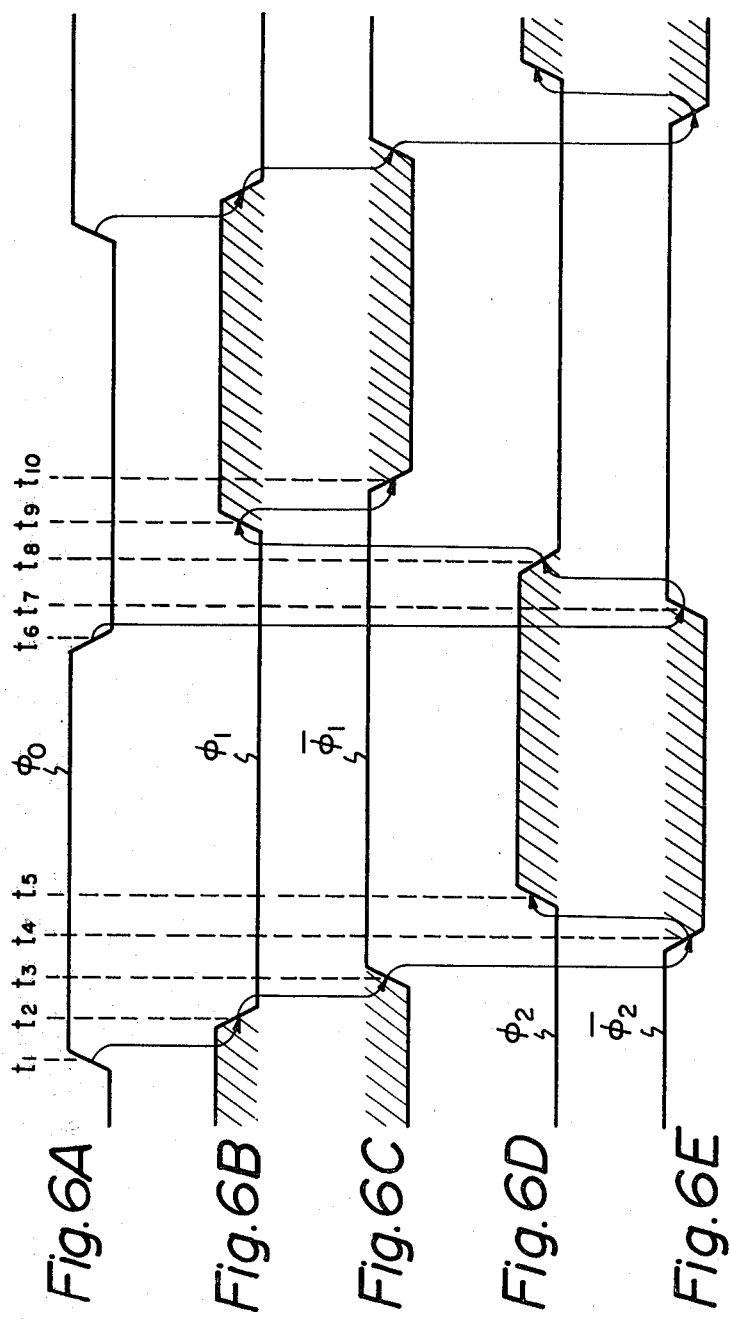

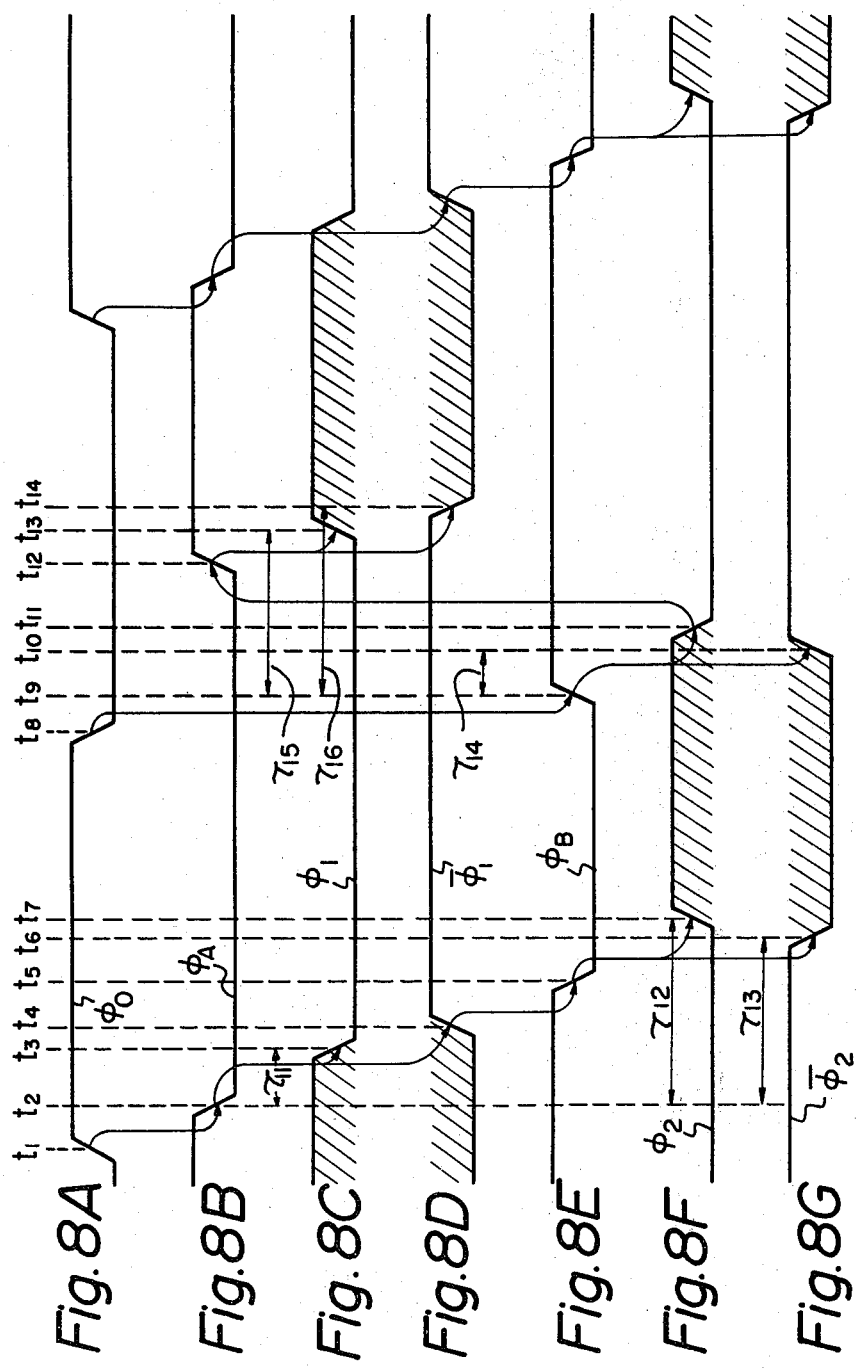

CLOCK GENERATOR CIRCUIT

BACKGROUND OF THE INVENTION

1. Field of the Invention

The present invention relates to a clock generator circuit for generating two pairs of clock signals by using a reference clock signal.

As the case may require, four clock signals, that is, two pairs of clock signals are used. For example, such clock signals are used in a switched cpacitor integrator. In this case, it is necessary that a pair of clock signals opposite in phase to each other are not overlapped with another pair of clock signals opposite in phase to each other.

2. Description of the Prior Art

One conventional clock generator circuit comprises a pair of NOR circuits cross-coupled to each other, which serve as an R-S flip-flop. This clock generator circuit generates two non-overlapping clock signals $\phi_1$ and $\phi_2$ opposite in phase to each other. (See: Electronics, page 99, Jan. 20, 1977.) In this circuit, when an inverter is connected to the output terminal of each of the NOR circuits, two inverted clock signals $\bar{\phi}_1$ and $\bar{\phi}_2$ of the clock signals $\phi_1$ and $\phi_2$ are also obtained. Thus, the clock generator circuit associated with such inverters generates two pairs of clock signals $\phi_1$ and $\bar{\phi}_1$, and $\phi_2$ and $\bar{\phi}_2$.

However, in the above-mentioned circuit, due to fluctuation in manufacture, the delay time of each of the inverters is fluctuated. At worst, this delay time is so long that the clock signal $\bar{\phi}_1$ may be overlapped with the clock signals $\phi_2$ and $\bar{\phi}_2$ and in addition, the clock signal $\bar{\phi}_2$ may be overlapped with the clock signal $\phi_1$ and $\bar{\phi}_1$.

SUMMARY OF THE INVENTION

Therefore, it is an object of the present invention to provide a clock generator circuit for generating two pairs of clock signals in which a pair of clock signals are surely non-overlapped with the other pair of clock signals.

According to the present invention, there is provided a clock generator circuit for generating two pairs of clock signals by using a reference clock signal, comprising: first and second logic circuits, each having first and second input terminals and an output terminal, for generating first and second clock signals, respectively, the first input terminal of each of the first and second logic circuits receiving the reference clock signal; a first delay circuit, connected between the output terminal of the first logic circuit and the the second input terminal of the second logic circuit, for delaying and inverting the first clock signal so as to generate a third clock signal which forms a pair with the first clock signal; a second delay circuit, connected between the output terminal of the second logic circuit and the second input terminal of the first logic circuit, for delaying and inverting the second clock signal so as to generate a fourth clock signal which forms a pair with the second clock signal; the first logic circuit detecting a change of the potential of the fourth clock signal so as to change the potential of the first clock signal, when the potential of the reference clock signal is high; and the second logic circuit detecting a change of the potential of the third clock signal so as to change the potential of the second clock signal, when the potential of the reference clock is low.

The present invention will be more clearly understood from the description as set forth below contrasting the present invention with the conventional circuit and with reference to the accompanying drawings, wherein:

BRIEF DESCRIPTION OF THE DRAWINGS

FIGS. 4A through 4F are timing diagrams showing the signals appearing in the circuit of FIG. 3;

FIGS. 6A through 6E are timing diagrams showing the signals appearing in the circuit of FIG. 5;

FIGS. 8A through 8G are timing diagrams showing the signals appearing in the circuit of FIG. 7.

In FIG. 1, which illustrates a general switched capacitor integrator, $SW_1$ and $SW_2$ are switches; $C_1$ and $C_2$ are capacitors; and OP is an operational amplifier. In this case, the capacitor $C_2$ forms a negative feedback path of the operational amplifier OP. When the switch $SW_1$ is turned on, the capacitor $C_1$ is charged by an input voltage $V_{in}$. After that, at the next timing, the switch $SW_1$ is turned off and, in turn, the switch $SW_2$ is turned on. As a result, the charges stored in the capacitor $C_1$ are moved to the capacitor $C_2$. Since the operational amplifier OP operates so as to hold its input terminal (−) at the ground level, an output voltage $V_{out}$ appears in accordance with the quantity of the charges stored in the capacitor $C_1$.

The input voltage $V_{in}$ is sampled by repeating the above-mentioned operation at a frequency of, for example, 128 kHz, so that the output voltage $V_{out}$, corresponding to an integrated value of the sampled voltages, is obtained.

Figure 1:
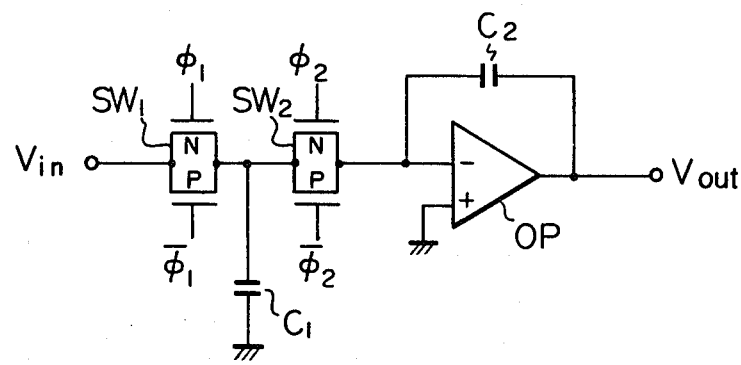
FIG. 1 is a circuit diagram illustrating a general switched capacitor integrator.

In FIG. 1, each of the switches $SW_1$ and $SW_2$ comprises a CMOS (Complementary MOS) circuit formed by a p-channel type transistor and a n-channel type transistor. Therefore, when the potential of a clock signal $\phi_1$ and the potential of its inverted signal $\bar{\phi}_1$ are high and low, respectively, the switch $SW_1$ is turned on, while, when the potential of each of the signals $\phi_1$ and $\bar{\phi}_1$ are low and high, respectively, the switch $SW_1$ is turned off. Similarly, when the potential of a clock signal $\phi_2$ and the potential of its inverted signal $\bar{\phi}_2$ are high and low, respectively, the switch $SW_2$ is turned on, while, when the potential of each of the signals $\phi_2$ and $\bar{\phi}_2$ are low and high, respectively, the switch $SW_2$ is turned off.

It should be noted that the switches $SW_1$ and $SW_2$ should not be simultaneously turned on. If the switches $SW_1$ and $SW_2$ are simultaneously turned on, the capacitor $C_2$ is charged directly by the input voltage $V_{in}$ and as a result, a normal integration operation can not be performed.

FIGS. 2A through 2D are timing diagrams showing the signals appearing in the circuit of FIG. 1. As illustrated in FIGS. 2A through 2D, in order to prevent the switches SW$_1$ and SW$_2$ (FIG. 1) from being turned on simultaneously, a pair of the clock signals $\phi_1$ and $\overline{\phi}_1$ are non-overlapped with the other pair of the clock signals $\phi_2$ and $\overline{\phi}_2$. In more detail, the high potential of the clock signal $\phi_1$ is non-overlapped with the high potential of the clock signal $\phi_2$ and the low potential of the clock signal $\overline{\phi}_2$. In addition, the low potential of the clock signal $\overline{\phi}_1$ is non-overlapped with the high potential of the clock signal $\phi_2$ and the low potential of the clock signal $\overline{\phi}_2$.

Figure 3:
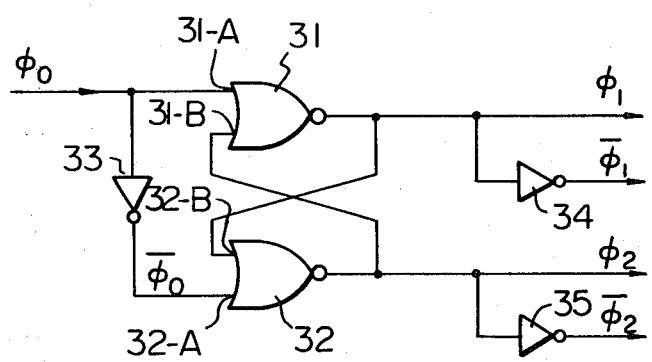
FIG. 3 is a logic circuit diagram illustrating one conventional clock generator circuit.
Figures 2A, 2B, 2C, 2D:
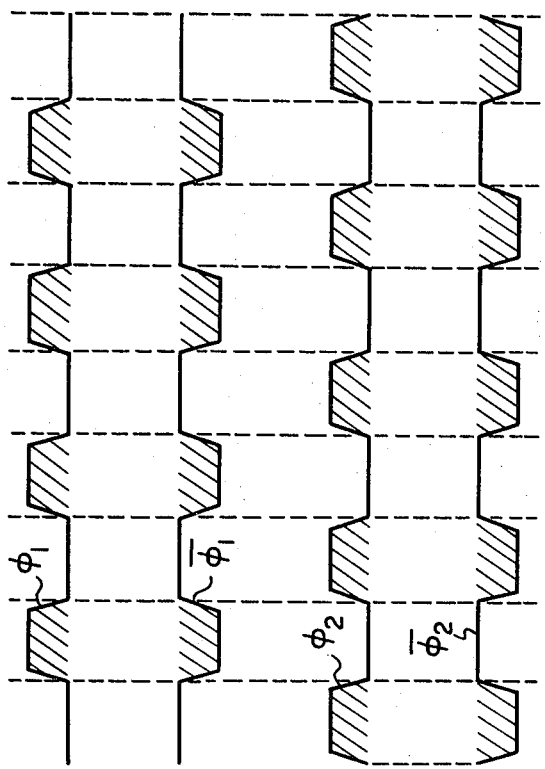
FIGS. 2A through 2D are timing diagrams showing the signals appearing in the circuit of FIG. 1.

FIG. 3 is a logic circuit diagram illustrating one conventional clock generator circuit. As illustrated in FIG. 3, the clock generator circuit comprises two NOR circuits 31 and 32 cross-coupled to each other which serve as an R-S flip-flop. (See: Electronics, page 99, Jan. 20, 1977.) The NOR circuit 31 receives a reference clock signal $\phi_0$ directly, while the NOR circuit 32 receives the reference clock signal $\phi_0$ via an inverter 33. Each of the NOR circuits 31 generates clock signals $\phi_1$ and $\phi_2$, respectively, and in addition, clock signals $\overline{\phi}_1$ and $\overline{\phi}_2$ are obtained by inverting the clock signals $\phi_1$ and $\phi_2$, respectively. For this purpose, two inverters 34 and 35 are provided. Thus, two pairs of clock signals $\phi_1$ and $\overline{\phi}_1$, and $\phi_2$ and $\overline{\phi}_2$ are obtained.

FIGS. 4A through 4F are timing diagrams showing the signals in the circuit of FIG. 3. Referring to FIGS. 4A through 4F, the operation of the circuit of FIG. 3 will now be explained. At a time $t_1$, the potential of the reference clock signal $\phi_0$ is changed from low to high, as illustrated in FIG. 4A and, in turn, at a time $t_2$, the potential of a signal $\overline{\phi}_0$ is changed from high to low, as illustrated in FIG. 4B. In this state, since the potential at an input terminal 31-B of the NOR circuit 31, which is the same as the potential of the clock signal $\phi_2$ as illustrated in FIG. 4E, remains low, the NOR circuit 31 detects the change of the potential at an input terminal 31-A thereof, so that, at a time $t_3$, the potential of the clock signal $\phi_1$ is changed from high to low, as illustrated in FIG. 4C and, in turn, at a time $t_4$, the potential of the clock signal $\overline{\phi}_1$ is changed from low to high, as illustrated in FIG. 4D. In addition, in this state, since the potential at an input terminal 32-A of the NOR circuit 32, which is the same as the potential of the signal $\overline{\phi}_0$ as illustrated in FIG. 4B, remains low, the NOR circuit 32 detects the change of the potential at an input terminal 32-B thereof, so that, at a time $t_5$, the potential of the clock signal $\phi_2$ is changed from low to high, as illustrated in FIG. 4E and, in turn, at a time $t_6$, the potential of the clock signal $\overline{\phi}_2$ is changed from high to low, as illustrated in FIG. 4F.

As illustrated in FIGS. 4C, 4E and 4F, the high potential of the clock signal $\phi_1$ is never overlapped with the high potential of the clock signal $\phi_2$ and the low potential of the clock signal $\overline{\phi}_2$. Contrary to this, with regard to the clock signal $\overline{\phi}_1$, as illustrated in FIGS. 4D, 4E and 4F, if $\tau_1 > \tau_2$ where $\tau_1$ is a delay time of the inverter 34 and $\tau_2$ is a delay time of the NOR circuit 32, the low potential of the clock signal $\overline{\phi}_1$ is overlapped with the high potential of the clock singal $\phi_2$. In addition, if $\tau_1 > \tau_2 + \tau_3$ where $\tau_3$ is a delay time of the inverter 35, the low potential $\overline{\phi}_1$ is also overlapped with the low potential of the clock signal $\overline{\phi}_2$.

Similarly, when the potential of the reference clock signal $\phi_0$ is changed from high to low, as illustrated in FIGS. 4C, 4D and 4E, the high potential of the clock signal $\phi_2$ is never overlapped with the high potential of the clock signal $\phi_1$ and the low potential of the clock signal $\overline{\phi}_1$. Contrary to this, with regard to the clock signal $\overline{\phi}_2$, as illustrated in FIGS. 4C, 4D and 4F, if $\tau_3 > \tau_4$ where $\tau_4$ is a delay time of the NOR circuit 31, the low potential of the clock signal $\overline{\phi}_2$ is overlapped with the high potential of the clock signal $\phi_1$. In addition, if $\tau_3 > \tau_4 + \tau_1$, the low potential of the clock signal $\overline{\phi}_2$ is overlapped with the low potential of the clock signal $\overline{\phi}_1$.

However, the delay time $\tau_1$ of the inverter circuit 34 and the delay time $\tau_3$ of the inverter 35 are often variations due to fluctuation in manufacture. Accordingly, it may happen that $\tau_1 > \tau_2$ (or $\tau_2 + \tau_3$) or $\tau_3 > \tau_4$ (or $\tau_4 + \tau_1$) is satisfied. Thus, in the circuit of FIG. 3, the clock signals $\phi_1$ and $\overline{\phi}_1$ may be overlapped with the clock signals $\phi_2$ and $\overline{\phi}_2$.

Figure 5:
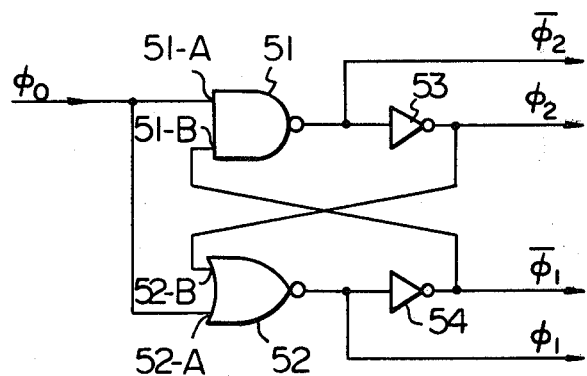
FIG. 5 is a logic circuit diagram illustrating an embodiment of the clock generator circuit according to the present invention.

FIG. 5 is a logic circuit diagram illustrating an embodiment of the clock generator circuit according to the present invention. As illustrated in FIG. 5, the clock generator circuit comprises a NAND circuit 51 and a NOR circuit 52 cross-coupled to each other, and two inverters 53 and 54. A reference clock signal $\phi_0$ is supplied commonly to an input terminal 51-A of the NAND circuit 51 and an input terminal 52-A of the NOR circuit 52. The NOR circuit 52 generates a clock signal $\phi_1$ and in turn, the inverter 54 generates a clock signal $\overline{\phi}_1$ which forms a pair with the clock signal $\overline{\phi}_1$, while the NAND circuit 51 generates a clock signal $\overline{\phi}_2$ and in turn, the inverter 53 generates a clock signal $\phi_2$ which forms a pair with the clock signal $\overline{\phi}_2$. Thus, two pairs of the clock signals $\phi_1$ and $\overline{\phi}_1$, $\phi_2$ and $\overline{\phi}_2$ are obtained.

FIGS. 6A through 6E are timing diagrams showing the signals appearing in the circuit of FIG. 5. Referring to FIGS. 6A through 6E, the operation of the circuit of FIG. 5 will now be explained. At a time $t_1$, the potential of the reference clock signal $\phi_0$ is changed from low to high, as illustrated in FIG. 6A. In this state, since the potential at the input terminal of the NOR circuit 52 remains low, the NOR circuit 52 detects the change of the potential at the input terminal 52-A so that, at a time $t_2$, the potential of the clock signal $\phi_1$ is changed from high to low as illustrated in FIG. 6B and in turn, at a time $t_3$, the potential of the clock signal $\overline{\phi}_1$ is changed from low to high as illustrated in FIG. 6C. In addition, in this state, since the potential at the input terminal 51-A of the NAND circuit 51, which is the same as the potential of the reference clock signal $\phi_0$, remains high as illustrated in FIG. 6A, the NAND circuit 51 detects the change of the potential at the input terminal 51-B so that, at a time $t_4$, the potential of the clock signal $\overline{\phi}_2$ is changed from high to low as illustrated in FIG. 6E and, in turn, the potential of the clock signal $\phi_2$ is changed from low to high as illustrated in FIG. 6D.

As illustrated in FIGS. 6B, 6D and 6E, since the rise of the potential of the clock signal $\phi_2$ and the fall of the potential of the clock signal $\overline{\phi}_2$ follow the fall of the potential of the clock signal $\phi_1$, the high potential of the clock signal $\phi_1$ is never overlapped with the high potential of the clock signal $\phi_2$ and the low potential of the clock signal $\overline{\phi}_2$. In addition, as illustated in FIGS. 6C, 6D and 6E, since the rise of the potential of the clock signal $\phi_2$ and the fall of the potential of the clock signal $\overline{\phi}_2$ follow the rise of the potential of the clock signal $\overline{\phi}_1$, the low potential of the clock signal $\overline{\phi}_1$ is never overlapped with the high potential of the clock signal $\phi_2$ and the low potential of the clock signal $\overline{\phi}_2$.

On the other hand, at a time $t_6$, the potential of the reference clock signal $\phi_0$ falls as illustrated in FIG. 6A and after that, at a time $t_7$, the potential of the clock signal $\bar{\phi}_2$ rises as illustrated in FIG. 6E. And, in turn, at a time $t_8$, the potential of the clock signal $\phi_2$ falls as illustrated in FIG. 6D. After that, at a time $t_9$, the potential of the clock signal $\phi_1$ rises as illustrated in FIG. 6B and, in turn, at a time $t_{10}$, the potential of the clock signal $\bar{\phi}_1$ falls as illustrated in FIG. 6C. Therefore, the high potential of the clock signal $\phi_2$ is never overlapped with the high potential of the clock signal $\phi_1$ and the low potential of the clock signal $\bar{\phi}_1$ and, in addition, the low potential of the clock signal $\bar{\phi}_2$ is never overlapped with the high potential of the clock signal $\phi_1$ and the low potential of the clock signal $\bar{\phi}_1$.

Figure 7:
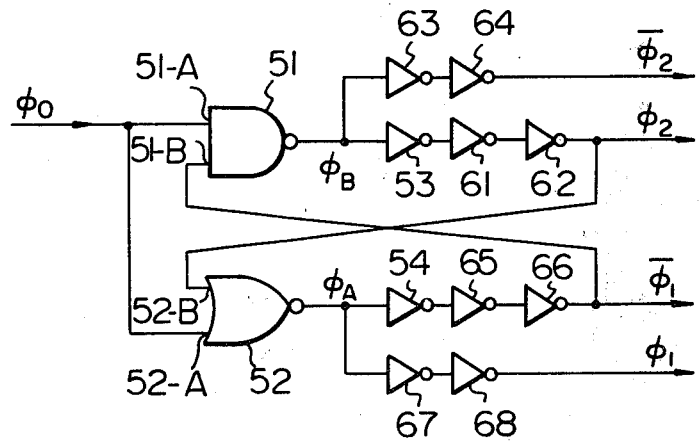
FIG. 7 is a logic circuit diagram illustrating another embodiment of the clock generator circuit according to the present invention.

FIG. 7 is a logic circuit diagram illustrating another embodiment of the clock generator circuit according to the present invention. In FIG. 7, inverters 61 through 68 are added to FIG. 5. The operation of the circuit of FIG. 7 is similar to that of the circuit of FIG. 5.

FIGS. 8A through 8G are timing diagrams showing the signals appearing in the circuit of FIG. 7. Referring to FIGS. 8A through 8G, the operation of the circuit of FIG. 7 will now be explained. At a time $t_1$, the potential of the reference clock signal $\phi_0$ rises as illustrated in FIG. 8A. After that, at a time $t_2$, the potential of a signal $\phi_A$ generated from the NOR circuit 52 falls, as illustrated in FIG. 8B. As a result, at a time $t_3$, the potential of the clock signal $\phi_1$ falls as illustrated in FIG. 8C and, in turn, at a time $t_4$, the potential of the clock signal $\bar{\phi}_1$ rises as illustrated in FIG. 8D. After the rise of the clock signal $\bar{\phi}_1$, at a time $t_5$, the potential of the signal $\phi_B$ generated from the NAND circuit 51 falls. As a result, at a time $t_6$, the potential of the clock signal $\bar{\phi}_2$ falls as illustrated in FIG. 8G and, in turn, at a time $t_7$, the potential of the clock signal $\phi_2$ rises as illustrated in FIG. 8F.

As illustrated in FIGS. 8D, 8F and 8G, since the rise of the potential of the clock signal $\phi_2$ and the fall of the potential of the clock signal $\bar{\phi}_2$ follow the rise of the potential of the clock signal $\bar{\phi}_1$, the low potential of the clock signal $\bar{\phi}_1$ is never overlapped with the high potential of the clock signal $\phi_2$ and the low potential of the clock signal $\bar{\phi}_2$.

In order to prevent the high potential of the clock signal $\phi_1$ from being overlapped with the high potential of the clock signal $\phi_2$ and the low potential of the clock signal $\bar{\phi}_2$, the following condition should be satisfied:

$$\tau_{11} > \tau_{12} \text{ and } \tau_{11} > \tau_{13} \qquad (1)$$

where $\tau_{11}$ is the total delay time of the inverters 67 and 68; $\tau_{12}$ is the total delay time of the inverters 54, 65, 66, the NAND circuit 51 and the inverters 53, 61 and 62; and $\tau_{13}$ is the total delay time of the inverters 54, 65, 66, the NAND circuit 51 and the inverters 63 and 64.

On the other hand, at a time $t_8$, the potential of the reference clock signal $\phi_0$ falls as illustrated in FIG. 8A. After that, at a time $t_9$, the potential of the signal $\phi_B$ rises as illustrated in FIG. 8E. As a result, at a time $t_{10}$, the potential of the clock signal $\bar{\phi}_2$ rises as illustrated in FIG. 8G and, in turn, at a time $t_{11}$, the potential of the clock signal $\phi_2$ falls as illustrated in FIG. 8F. After the fall of the potential of the clock signal $\phi_2$, at a time $t_{12}$, the potential of the signal $\phi_A$ rises as illustrated in FIG. 8B. As a result, at a time $t_{13}$, the potential of the clock signal $\phi_1$ rises as illustrated in FIG. 8C and, in turn, at a time $t_{14}$, the potential of the clock signal $\bar{\phi}_1$ falls as illustrated in FIG. 8D.

As illustrated in FIGS. 8C, 8D and 8F, since the rise of the potential of the clock signal $\phi_1$ and the fall of the potential of the clock signal $\bar{\phi}_1$ follow the fall of the potential of the clock signal $\bar{\phi}_2$, the high potential of the clock signal $\phi_2$ is never overlapped with the high potential of the clock signal $\phi_1$ and the low potential of the clock signal $\bar{\phi}_1$.

In order to prevent the low potential of the clock signal $\bar{\phi}_2$ from being overlapped with the high potential of the clock signal $\phi_1$ and the low potential of the clock signal $\bar{\phi}_1$, the following condition should be satisfied:

$$\tau_{14} > \tau_{15} \text{ and } \tau_{14} > \tau_{16} \qquad (2)$$

where $\tau_{14}$ is the total delay of the inverters 63 and 64; $\tau_{15}$ is the total delay time of the inverters 53, 61 and 62, the NOR circuit 52 and the inverters 67 and 68; and $\tau_{16}$ is the total delay time of the inverters 53, 61 and 62, the NOR circuit 52 and the inverters 54, 65 and 66.

Note that the above-mentioned conditions (1) and (2) can be easily attained.

As explained hereinbefore, the clock generator circuit for generating two pairs of clock signals according to the present invention has an advantage in that a pair of clock signals are not overlapped with another pair of clock signals. Therefore, when the clock signals obtained by the clock generator circuit according to the present invention are applied to the switches SW$_1$ and SW$_2$ of the switched capacitor integrator of FIG. 1, the switched capacitor integrator can perform a reliable integration operation.

We claim:

1. A clock generator circuit for generating two pairs of clock signals by using a reference clock signal, comprising:
   first and second logic circuits, each having first and second input terminals and an output terminal, for generating first and second clock signals, respectively, the first input terminal of each of said first and second logic circuits receiving said reference clock signal;
   a first delay circuit, connected between the output terminal of said first logic circuit and the second input terminal of said second logic circuit, for delaying and inverting said first clock signal so as to generate a third clock signal which forms a pair with said first clock signal;
   a second delay circuit, connected between the output terminal of said second logic circuit and the second input terminal of said first logic circuit, for delaying and inverting said second clock signal so as to generate a fourth clock signal which forms a pair with said second clock signal;
   said first logic circuit detecting a change of the potential of said fourth clock signal so as to change the potential of said first clock signal, when the potential of said reference clock signal is high; and
   said second logic circuit detecting a change of the potential of said third clock signal so as to change the potential of said second clock signal, when the potential of said reference clock is low.

2. A clock generator circuit as set forth in claim 1, wherein said first and second logic circuits are a NAND circuit and a NOR circuit, respectively.

3. A clock generator circuit as set forth in claim 1, further comprising:
   a third delay circuit, connected to the output terminal of said first logic circuit, for delaying said first clock signal;

a fourth delay circuit, connected to the output terminal of said second logic circuit, for delaying said second clock signal, the delay time of said third delay circuit being less than the total delay time of said first delay circuit, said second logic circuit and said second delay circuit and being less than the total delay time of said first delay circuit, said second logic circuit and said fourth delay circuit; and the delay time of said fourth delay circuit being less than the total delay time of said second delay circuit, said first logic circuit and said first delay circuit and being less than the total delay time of said second delay circuit, said first logic circuit and said third delay circuit.

* * * * *

UNITED STATES PATENT AND TRADEMARK OFFICE
CERTIFICATE OF CORRECTION

PATENT NO. : 4,417,158

DATED : Nov. 22, 1983

INVENTOR(S) : Ito et al.

It is certified that error appears in the above-identified patent and that said Letters Patent is hereby corrected as shown below:

Column 1, line 11, "cpacitor" should be --capacitor--.
Column 5, line 47, ">" (both occurrences) should be --<--.
Column 6, line 11, ">" (both occurrences) should be --<--.

Signed and Sealed this

Twenty-sixth Day of June 1984

[SEAL]

Attest:

GERALD J. MOSSINGHOFF

Attesting Officer

Commissioner of Patents and Trademarks